United States Patent
Kanasaku et al.

(10) Patent No.: US 10,249,774 B2
(45) Date of Patent: Apr. 2, 2019

(54) CONDUCTIVE PASTE FOR FORMING SOLAR CELL ELECTRODE

(71) Applicant: SHOEI CHEMICAL INC., Shinjuku-ku, Tokyo (JP)

(72) Inventors: Tadashi Kanasaku, Tosu (JP); Kousuke Nishimura, Tosu (JP); Masayuki Kurahashi, Tosu (JP)

(73) Assignee: SHOEI CHEMICAL INC., Shinjuku-ku, Tokyo (JP)

( * ) Notice: Subject to any disclaimer, the term of this patent is extended or adjusted under 35 U.S.C. 154(b) by 0 days.

(21) Appl. No.: 15/551,488

(22) PCT Filed: Mar. 2, 2016

(86) PCT No.: PCT/JP2016/056396
§ 371 (c)(1),
(2) Date: Aug. 16, 2017

(87) PCT Pub. No.: WO2016/147867
PCT Pub. Date: Sep. 22, 2016

(65) Prior Publication Data
US 2018/0033897 A1     Feb. 1, 2018

(30) Foreign Application Priority Data
Mar. 13, 2015  (JP) ................................ 2015-051367

(51) Int. Cl.
| | | |
|---|---|---|
| *H01B 1/22* | (2006.01) | |
| *H01L 31/00* | (2006.01) | |
| *H01L 31/0224* | (2006.01) | |
| *C03C 8/04* | (2006.01) | |
| *H01B 1/02* | (2006.01) | |

(52) U.S. Cl.
CPC ........ *H01L 31/022425* (2013.01); *C03C 8/04* (2013.01); *H01B 1/02* (2013.01); *H01B 1/22* (2013.01); *H01L 31/0224* (2013.01)

(58) Field of Classification Search
CPC ... H01B 1/00; H01B 1/16; H01B 1/22; B05D 5/12; H01L 35/00
See application file for complete search history.

(56) References Cited

U.S. PATENT DOCUMENTS 9,064,616 B2 * 6/2015 Yoshida .................... C03C 8/02
2006/0289055 A1  12/2006 Sridharan et al.
2013/0167923 A1  7/2013 Nakamura et al.
2015/0206992 A1 * 7/2015 Guo ...................... C01B 19/004
                                                          136/244
2016/0369111 A1 * 12/2016 Moyer ..................... C09D 5/24

FOREIGN PATENT DOCUMENTS

| EP | 2 317 561 A2 | 5/2011 |
|---|---|---|
| JP | 10-326522 A | 12/1998 |
| JP | 11-213754 A | 8/1999 |
| JP | 2001-093326 A | 4/2001 |
| JP | 2001-118425 A | 4/2001 |
| JP | 2004-207493 A | 7/2004 |
| JP | 2007-242912 A | 9/2007 |
| JP | 2008-543080 A | 11/2008 |
| JP | 2009-194121 A | 8/2009 |
| JP | 2011-096747 A | 5/2011 |
| JP | 2012-124266 A | 6/2012 |
| JP | 2013-131464 A | 7/2013 |
| WO | WO 2012/046719 A1 | 4/2012 |
| WO | WO 2014/169444 A1 | 10/2014 |

OTHER PUBLICATIONS

English language machine translation of JP 2011096747 A (pub May 2011).*
English translation of International Preliminary Report Patentability for PCT/JP2016/056396, dated Sep. 19, 2017 (2 pgs).
English translation of Written Opinion of the International Searching Authority for PCT/JP2016/056396, dated Sep. 19, 2017 (3 pgs).
International Search Report for PCT/JP2016/056396 (2 pgs) (dated Apr. 2016).
Concise Explanation of Relevance (1 pg) (No pub date provided).
European Search Report for corresponding application No. 16764697.5, dated Sep. 12, 2018 (8 pgs).
Concise Explanation of Relevance (2 pgs) (no date).

* cited by examiner

*Primary Examiner* — Mark Kopec
(74) *Attorney, Agent, or Firm* — Flynn Thiel, P.C.

(57) ABSTRACT

A conductive paste for forming solar cell electrodes that obtains favorable electrical characteristics and sufficient adhesion strength to a substrate. The conductive paste for forming a solar cell electrode includes the following: a tellurium-based glass frit containing 30-70 mol % of tellurium, 15-40 mol % of tungsten, 5-30 mol % of zinc, 0-20 mol % of boron, and 0-10 mol % of zirconium (where a total content of boron and zirconium is greater than 0 mol %) in terms of oxides; a conductive powder having silver as a main component and specific surface area of 0.4 m²/g or more; and an organic vehicle.

2 Claims, 2 Drawing Sheets

CONDUCTIVE PASTE FOR FORMING SOLAR CELL ELECTRODE

BACKGROUND OF THE INVENTION

1. Field of the Invention

The present invention relates to a fired-type conductive paste containing conductive powder and glass frit and used to form solar cell electrodes.

2. Description of the Related Art

Conventionally, an ordinary solar cell elements is provided with a silicon-based semiconductor substrate, a diffusion layer, an anti-reflection film, a rear electrodes and a front electrodes (hereinafter also called "light-receiving electrodes" where necessary). When forming the front electrodes in particular, the electrodes are formed by screen printing, stencil printing, or the like using a conductive paste in which conductive particles having a metal such as silver as a main component, glass frit, an organic vehicle, and the like are mixed together.

In a crystalline silicon solar cell shown in FIG. 1 as an example, a diffusion layer 3 is formed on the front surface (light-receiving surface) of a p-type crystalline silicon substrate 4 having a concavoconvex shape generally called a textured structure. Here, the diffusion layer 3 is formed by the diffusion of impurities such as phosphorous (P) into the light-receiving surface of the semiconductor substrate 4 and serves as a region exhibiting a conductivity type opposite to the conductivity type of the semiconductor substrate 4. In this example, the diffusion layer 3 will be described as an n-type. The n-type diffusion layer 3 is formed, for example, when the semiconductor substrate 4 is arranged in a diffusion furnace and heated in phosphorous oxychloride ($POCl_3$) or the like. On the diffusion layer 3, an insulative anti-reflection film 2 made of silicon nitride, silicon oxide, titanium oxide, or the like is formed to protect a solar cell element besides performing an anti-reflection function. In the case of, for example, silicon nitride (hereinafter called "SiN"), the anti-reflection film 2 is formed by a plasma CVD method or the like using the mixed gas of silane ($SiH_4$) and ammonia ($NH_3$). The anti-reflection film 2 is formed to have, for example, a refractive index of about 1.8-2.3 and a thickness of about 5-100 nm in consideration of the refractive index difference and the like between the anti-reflection film 2 and the semiconductor substrate 4.

After that, the above conductive paste is printed and coated in a grid shape on the anti-reflection film 2 by a screen printing method or the like, and fired at a temperature of about 500-900° C. to form front electrodes 1. At the time of the firing, the anti-reflection film 2 is generally dissolved and removed by the action of the glass frit contained in the conductive paste to achieve the electrical connection between the front electrodes 1 and the n-type diffusion layer 3. This phenomenon is generally called fire-through.

On the rear side of the semiconductor substrate 4, on the other hand, a high concentration p-type BSF (Back Surface Field) layer into which aluminum or the like is diffused and rear electrodes 5 are formed.

In order to favorably perform the fire-through, it is preferable to use a glass having a good solubility with the anti-reflection film 2 as the glass frit contained in the conductive paste. Particularly, glass containing lead oxide has been often used as a glass frit contained in a conductive paste for forming front electrodes on the grounds that the softening point of the glass is easily adjusted, adhesion (adhesion strength) to the substrate is excellent, the fire-through can be relatively favorably performed, and excellent solar cell characteristics are obtained.

For example, in silver pastes for forming solar cell electrodes described in Japanese Patent Publication No. H11-213754, Japanese Patent Publication No. 2001-093326, and Japanese Patent Publication No. H10-326522, lead-borosilicate-based glass frit is used. In Japanese Patent Publication No. 2001-118425, lead-borate-based glass frit is described besides lead-borosilicate-based glass frit.

Meanwhile, in the above fire-through, the front electrodes 1 do not penetrate the anti-reflection film 2 due to a fluctuation in the action of the glass frit at the time of firing the front electrodes 1, whereby there occur problems that a stable ohmic contact is not obtained between the front electrodes 1 and the n-type diffusion layer 3 formed on the surface of the semiconductor substrate 4 and the adhesion strength fluctuates. The insufficient ohmic contact causes the loss of the extraction of an output, whereby there occur problems that the conversion efficiency of a solar cell reduces and current-voltage characteristics deteriorate.

On the other hand, as described in the paragraph [0004] of Japanese Patent Publication No. H10-326522, the paragraph [0017] of Japanese Patent Publication No. 2004-207493, or the like, there has been known a problem that voltage characteristics deteriorate when the fire-through is excessively performed. As described above, the anti-reflection film 2 has a thickness of about 5-100 nm at most. Therefore, when the front electrodes 1 penetrate not only the anti-reflection film 2 but also the n-type diffusion layer 3 serving as the underlayer of the anti-reflection film 2 and erode the inside of the semiconductor substrate 4, there could be possibilities of breaking a pn junction and adversely affecting a fill factor (hereinafter abbreviated as "FF") determined by the measurement of the current-voltage characteristics. In addition, since the penetration is more likely to occur when the n-type diffusion layer 3 is further thinned to achieve a high efficiency, the control of the penetration becomes further difficult.

FIG. 2 is a view obtained when the interface between the front electrodes and the semiconductor substrate of a commercially-available solar cell substrate is observed by a transmission electron microscope (TEM). Note that lead-based glass is used in the front electrodes in the commercially-available solar cell. In FIG. 2, a lead-based glass layer 6 containing a silver component in a conductive paste exists between a front electrode 1 and a SiN layer 2 serving as an anti-reflection film, and a part 7 of the glass layer 6 penetrates the SiN layer 2 and contacts a silicon substrate 4 (or an n-type diffusion layer 3). However, it appears that fire-through is excessively advanced at a part 8 of the glass layer 6 and the semiconductor substrate 4 is deeply eroded in a protrusion shape.

Aside from the above circumstances, there has been a demand for switching to materials and components in which lead is not used for solar cells as well due to the raised awareness of ecological problems in recent years. Therefore, like lead-based glass, the development of alternative materials and components has been advanced so that the softening point of a glass is easily adjusted, adhesion (adhesion strength) to a substrate is excellent, fire-through can be favorably performed, and excellent solar cell characteristics are obtained.

As an example, front electrodes are formed using a borosilicate-zinc-based glass frit in Japanese Patent Publication No. 2001-118425, borosilicate-bismuth-based glass frit and borosilicate-zinc-based glass frit in Japanese Patent Publication No. H10-326522, silicate-bismuth-based glass frit in PCT Application Published in Japanese Translation No. 2008-543080, and zinc-borate-based glass frit in Japanese Patent Publication No. 2009-194121. However, according to research by the present inventors, even when such a lead-free glass is used, the control of the fire-through is difficult in many cases since an ohmic contact is not obtained due to insufficient fire-through or a part of the front electrodes deeply erodes the semiconductor substrate due to the excessive advancement of the fire-through like shown in FIG. 2.

Particularly in recent years, attention has been paid to technologies using tellurium-based glass to form solar cell electrodes. For example, Japanese Patent Publication No. 2011-96747 filed by the present applicant discloses a technology for combining a tellurium-based glass containing 25-90 mol % of tellurium oxide in a conductive paste and forming solar cell electrodes using the paste. Japanese Patent Publication No. 2011-96747 discusses plenty of tellurium-based glasses and indicates that any of the glasses obtains a sufficient ohmic contact with the control of the fire-through.

SUMMARY OF THE INVENTION

Problems to be Solved by the Invention

The present invention has been made as a result of further advancing the research and development of the tellurium-based glasses described in Japanese Patent Publication No. 2011-96747 and has an object of providing a conductive paste for forming solar cell electrodes that obtains favorable electrical characteristics and sufficient adhesion strength to a substrate.

The present invention has the following configurations.

(1) A conductive paste for forming a solar cell electrode including: a tellurium-based glass frit containing 30-70 mol % of tellurium, 15-40 mol % of tungsten, 5-30 mol % of zinc, 0-20 mol % of boron, and 0-10 mol % of zirconium (where a total content of boron and zirconium is greater than 0 mol %) in terms of oxides; a conductive powder having silver as a main component and specific surface area of 0.4 $m^2/g$ or more; and an organic vehicle.

(2) The conductive paste for forming the solar cell electrode according to the above item (1), wherein the specific surface area of the conductive powder is 1.0 $m^2/g$ or less.

(3) The conductive paste for forming the solar cell electrode according to the above item (1) or (2), wherein the tellurium-based glass frit contains 5 mol % or more of boron in terms of oxides.

(4) The conductive paste for forming the solar cell electrode according to any one of the above items (1) to (3), wherein the tellurium-based glass frit contains both boron and zirconium.

(5) The conductive paste for forming the solar cell electrode according to any one of the above items (1) to (4), wherein the tellurium-based glass frit contains 40-60 mol % of tellurium, 20-30 mol % of tungsten, 7-20 mol % of zinc, 5-10 mol % of boron, and 1-5 mol % of zirconium in terms of oxides.

(6) The conductive paste for forming the solar cell electrode according to any one of the above items (1) to (5), wherein 0.1-10 mass parts of the tellurium-based glass frit is contained with respect to 100 mass parts of the conductive powder.

According to the present invention, a conductive paste that enables the formation of excellent solar cell electrodes can be obtained.

DESCRIPTION OF THE PREFERRED EMBODIMENTS

Figure 1:
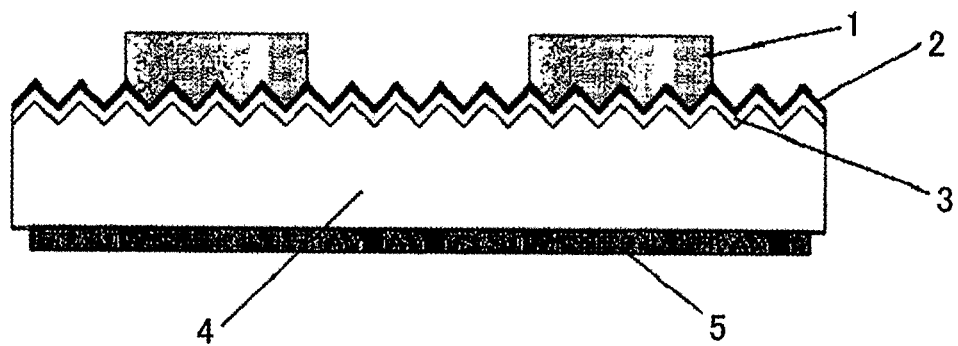
FIG. 1 is a schematic view of a solar cell element.
Figure 2:
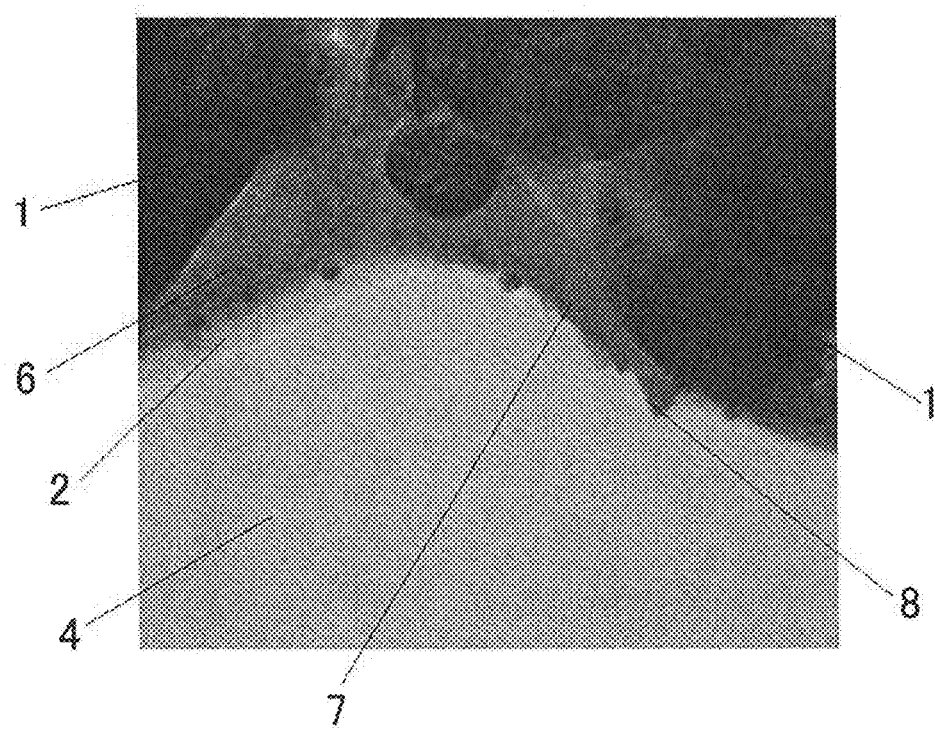
FIG. 2 is a TEM photograph at the interface between front electrodes using conventional lead-based glass and a substrate.

Hereinafter, an embodiment of a conductive paste and a solar cell element according to the present invention will be described, but the scope of the present invention is not limited to the following one. In addition, the dash "-" indicating a numerical value range in the following description indicates a range including numerical values described before and after the dash "-" unless otherwise noticed.

First, the conductive paste according to the present invention will be described.

The conductive paste of the present invention is one in which a specific conductive powder and a specific tellurium-based glass frit are dispersed into an organic vehicle, and the paste can be suitably used to form electrodes on the surface (light-receiving surface) of a solar cell. Specifically, the paste of the present invention is printed and fired on an anti-reflection film made of silicon nitride or the like on the surface of the solar cell to obtain electrodes that exhibit excellent solar cell characteristics.

Hereinafter, respective components will be described.

In the present invention, the conductive powder is a silver-based conductive powder having silver as a main component and a specific surface area of 0.4 $m^2/g$ or more measured by a BET method. Although no specific reasons have been found, according to research by the present inventors, the electrical characteristics, adhesion strength to a substrate, and the extent of a process window with respect to a firing temperature greatly depend on the combination of the composition of the tellurium-based glass contained in a paste and the specific surface area of the conductive powder when solar cell electrodes are formed using the conductive paste containing the tellurium-based glass. In other words, the function and effect of the present invention cannot be sufficiently obtained even if the tellurium-based glass according to the present invention is combined with a conductive powder having a specific surface area of less than 0.4 $m^2/g$. For example, the conductive pastes of Samples 39-41 in Table 2 that will be described later contain the tellurium-based glass according to the present invention. However, the conductive powder contained in the paste has a specific surface area of less than 0.4 $m^2/g$, and thus substantial results are not obtained under the firing conditions of an experimental example in Table 2. That is, the function and effect of the present invention is obtained only when the conductive powder having a specific surface area of 0.4 $m^2/g$ or more and the tellurium-based glass that will be described later are combined together.

The specific surface area is preferably 0.45 $m^2/g$ or more and particularly preferably 0.5 $m^2/g$ or more.

Note that the specific surface area does not particularly have an upper limit. However, when the specific surface area is too great, the conductive powder is likely to be sintered at a low temperature, which causes a difficulty in matching with other components in the paste due to the possibility of such as inhibiting the fluidity of the glass or the combustibility of the organic vehicle at the time of firing. Therefore, the specific surface area is preferably 1.0 m²/g or less.

The shape of the conductive powder can be a conventional one such as a spherical shape, a flake shape, and a dendroid shape. In addition, a silver-coated composite powder having a silver layer at least on its surface, an alloy having silver as a main component, or the like may be used besides pure silver powder. Two or more types of silver powder having different average particle sizes, size distributions, shapes, or the like may be mixed together to be used. Further, silver powder and conductive powder other than silver may be mixed together to be used. A metal to be compounded, alloyed, or mixed with the silver powder is not particularly limited so long as the function and effect of the present invention is not ruined, but examples of the metal include aluminum, gold, palladium, copper, nickel. However, as the conductive powder having silver as a main component in the conductive paste of the present invention, it is preferable to use a conductive powder containing 51 mass % or more of silver and particularly preferable to use pure silver powder from the viewpoint of conductivity.

In the tellurium-based glass according to the present invention, tellurium oxide ($TeO_2$) is not vitrified alone but serves as a network former that forms the main structure of the glass, and the content of tellurium oxide is 30-70 mol % in terms of oxides with respect to the whole tellurium-based glass frit. The formation of the glass becomes difficult when the content is less than 30 mol % or greater than 70 mol %, and the content is preferably in the range of 40-60 mol %. Note that the contents of the respective components of the tellurium-based glass are indicated in terms of oxides with respect to the whole tellurium-based glass frit unless otherwise noticed.

The tellurium-based glass according to the present invention contains 15-40 mol % of tungstic oxide ($WO_3$) as a component that makes up for the formation of a glass network. The tungstic oxide contributes to the expansion and stability of the vitrification range and the stability of the tellurium-based glass. The content of the tungstic oxide is preferably in the range of 20-30 mol %.

The tellurium-based glass according to the present invention further contains 5-30 mol % of zinc oxide (ZnO) as a component that contributes to the expansion and stability of the vitrification range, and the content of the zinc oxide is preferably in the range of 7-20 mol %.

The tellurium-based glass according to the present invention contains at least one of boron oxide ($B_2O_3$) and zirconium oxide ($ZrO_2$). It is presumed that the boron oxide controls the fluidity of the glass and moderately reacts with a SiN layer on a substrate to contribute to an improvement in adhesion strength, and that the zirconium oxide effectively acts on the matching of the thermal expansion between an electrode layer and the substrate to contribute to an improvement in the adhesion strength of the electrode layer to the substrate. The tellurium-based glass according to the present invention contains 0-20 mol % of boron oxide and 0-10 mol % of zirconium oxide, but the total content of boron oxide and zirconium oxide is greater than 0 mol %. Preferably, the content of boron oxide is 5-10 mol %, and the content of zirconium oxide is 1-5 mol %. In addition, the tellurium-based glass preferably contains both the boron oxide and the zirconium oxide.

The tellurium-based glass according to the present invention may further contain an alkali metal element such as lithium and sodium, an alkali-earth metal element such as magnesium, calcium, strontium, and barium, and an element such as aluminum, dysprosium, yttrium, niobium, lanthanum, silver, titanium, germanium, phosphorous, and tantalum so long as the function and effect of the present invention is not ruined. Particularly, the tellurium-based glass preferably contains 0.1-4 mol % of aluminum in terms of oxides since there seems to be a tendency that the stability of the glass increases with the expansion of the vitrification range and the electrical characteristics improve.

The tellurium-based glass according to the present invention preferably has a softening point of 300-550° C. When the softening point is lower than 300° C., fire-through tends to be excessively performed, whereby it is highly likely that the front electrodes penetrate not only the SiN layer but also an n-type diffusion layer and a pn junction is broken. Further, when the softening point is higher than 550° C., the glass is not sufficiently supplied to the joining interface between the front electrodes and an anti-reflection film, the above specific structure cannot be obtained, an ohmic contact is impaired, and the adhesion strength of the electrodes is also reduced.

In the conductive paste of the present invention, a glass frit other than the tellurium-based glass frit may be used in combination. In order to control characteristics as the solar cell element through the control of a firing temperature and a reactivity with respect to the SiN layer and the like, any of known glasses such as a $SiO_2$—$B_2O_3$-based glass, $SiO_2$—$B_2O_3$—ZnO-based glass, $SiO_2$—$Bi_2O_3$-based glass, and $B_2O_3$—ZnO-based glass can be appropriately combined with the tellurium-based glass as glass frit other than the tellurium-based glass frit. The tellurium-based glass frit is preferably used in combination with the $SiO_2$—$B_2O_3$-based glass and the $SiO_2$—$B_2O_3$—ZnO-based glass.

The glass frit may be contained in the conductive paste of the present invention in an amount normally contained in a conductive paste for forming solar cell electrodes. As an example, 0.1-10 mass parts of the glass frit is preferably contained with respect to 100 mass parts of the conductive powder. When 0.1 mass parts or smaller of the glass frit is contained with respect to 100 mass parts of the conductive powder, the adhesion of the electrodes to the substrate or the strength of the electrodes extremely weakens. Further, when 10 mass parts or more of the glass frit is contained, there occur problems that the glass on the surface of the electrodes floats and contact resistance increases due to the glass flowing into the interface.

Note that the glass frit is required to be combined by a certain amount to favorably perform fire-through in a conventional conductive paste for forming solar cell electrodes. However, since the conductive paste of the present invention obtains a sufficient ohmic contact even when the combined amount of the glass is reduced, electrodes having a high conductivity can be obtained. The combined amount of the glass frit is more preferably 0.1-5 mass parts with respect to 100 mass parts of the conductive powder.

Although not particularly limited, the glass frit combined in the conductive paste of the present invention preferably has an average particle size of 0.5-5.0 μm.

Note that the conductive paste of the present invention preferably contains substantially no lead component. For example, the content of lead in the conductive paste is preferably 1000 ppm or less.

The conductive paste of the present invention can be, where necessary, appropriately combined with a plasticizer, a viscosity control agent, a surfactant, an oxidizing agent, a metal oxide, a metal organic compound, or the like generally added as an additive so long as the effect of the present invention is not ruined. In addition, the conductive paste may also be combined with a silver compound such as silver carbonate, silver oxide, and silver acetate described in Japanese Patent Application Laid-open No. 2007-242912 filed by the present applicant. Besides, copper oxide, zinc oxide, titanium oxide, or the like may also be appropriately added to the conductive paste to improve a firing temperature, solar cell characteristics, or the like.

The conductive paste of the present invention is produced in such a way as to disperse the above conductive powder, the glass frit, and the appropriate additives together into the organic vehicle and mix the same to obtain a paste, paint, or ink with a rheology suited to screen printing or other printing methods.

The organic vehicle is not particularly limited, and an organic binder, a solvent, and the like generally used as a vehicle for a silver paste are appropriately selected and combined together. Examples of the organic binder include celluloses, acrylic resins, phenol resins, alkyd resins, and rosin esters, and examples of the solvent include an organic solvent such as an alcohol-based organic solvent, an ether-based organic solvent, an ester-based organic solvent, a hydrocarbon-based organic solvent, water, and their mixed solvents. Here, the combined amount of the organic vehicle is not particularly limited, and is appropriately adjusted by a coating method or the like to an appropriate amount at which the conductive powder and an inorganic component such as the glass frit can be retained in the paste. However, the combined amount of the organic vehicle is generally about 1-40 mass parts with respect to 100 mass parts of the conductive powder.

The solar cell element to which the conductive paste of the present invention is applied is manufactured as an example in the following way.

The semiconductor substrate is made of monocrystalline silicon or polycrystalline silicon, and contains, for example, boron or the like to exhibit a conductivity type (for example, a p-type). A diffusion layer is formed on a surface on the side of the light-receiving surface of the semiconductor substrate by the diffusion of a phosphorous atom or the like to form a region exhibiting a conductivity type (for example, an n-type) opposite to the conductivity type of the semiconductor substrate, and then an anti-reflection film made of silicon nitride or the like is provided on the region. In addition, in order to form rear electrodes and a high concentration p-type BSF layer, an aluminum paste and a silver paste or a silver-aluminum paste is coated and dried on the surface of the substrate on a side opposite to the side of the light-receiving surface. Then, the conductive paste according to the present invention is coated and dried on the anti-reflection film by a screen printing method or the like. After that, the conductive paste is fired for a total firing time of about 1-30 minutes at a high temperature of 500-900° C. as a peak temperature to decompose and volatilize an organic vehicle component to form front electrodes, the rear electrodes, and the BSF layer at the same time. Note that the front electrodes and the rear electrodes are not necessarily formed at the same time. That is, the front electrodes may be formed after the firing of the rear electrodes, or the rear electrodes may be formed after the firing of the front electrodes. In addition, in order to obtain a high photoelectric conversion efficiency, the surface on the side of the light-receiving surface of the semiconductor substrate preferably has a concavoconvex-shaped (or a pyramid-shaped) texture structure.

EXAMPLES

Hereinafter, the present invention will be specifically described based on examples but is not limited to the examples.

First, 100 mass parts of silver powder having a specific surface area of 0.70 m$^2$/g measured by a BET method and 1.8 mass parts of glass frit having a composition shown in Table 1 were dispersed together in an organic vehicle composed of 1.4 mass parts of ethyl cellulose and 6.6 mass parts of butyl carbitol, to produce conductive pastes (Samples 1-38). Note that in the table, samples with a sign * added to their sample numbers are comparative examples, and respective components in the glass composition are expressed by mol % in terms of oxides with respect to the whole glass frit.

In order to conduct the initial evaluation of the above produced conductive pastes, a contact resistance was measured based on a TLM (transmission line model) method in the following way.

As a semiconductor substrate, 3 cm×3 cm of a square-shaped silicon substrate (commercial item) obtained by forming a SiN layer after diffusing phosphorous on a p-type silicon substrate having a pyramid-shaped texture structure on a surface on its light-receiving surface side and adjusting a sheet resistance value to 95-115)/sq. was used.

Next, a plurality of fine-line-shaped front electrodes having a width of 100 μm and a thickness of 15 μm was formed on the SiN layer at a pitch of 2 mm using the above produced Samples 1-38. Then, resistance values between a reference fine-line electrode and fine-line electrodes different in distance from the reference fine-line electrode were measured at five points using a digital multimeter (manufactured by HEWLETT PACKARD Company: 3458A MULTIMETER), and ½ of a y-intercept where the distances between the electrodes were plotted as x and the resistance values were plotted as y was calculated as contact resistivity. The calculation was performed twice for each of the samples, and their average values are also shown in Table 1.

Note that in this example, the formation of the above front electrodes was performed in such a way as to print the respective samples on the surface of the SiN layer of the above substrate and fire the same at a firing peak temperature of 780° C. for a total firing time of 70 seconds.

In order to examine the adhesion strength of the formed electrodes, a tensile strength test was conducted. A front electrode pattern for the tensile strength test was formed on the surface of the SiN layer of the substrate in the same way as the above, and then copper wire was attached to the front electrodes using solder and pulled upward in a vertical direction to measure and evaluate the adhesion strength. When the tensile strength was weak, the front electrodes were peeled off the substrate at the time of being pulled upward. When the tensile strength was strong, the front electrodes were not peeled off the substrate and were broken together with the substrate at the time of being pulled upward. The measurement was performed six times for each of the samples. Provided that the front electrodes were not peeled off the substrate and were broken together with the substrate four times or more out of the six times (hereinafter described as 4/6 or more), it was evaluated that the tensile strength required for the front electrodes was satisfied. The tensile strength is preferably 5/6 or more. The measurement results of the tensile strength are also shown in Table 1.

Note that signs in the column of "total evaluation" in the table are described as follows.

O: the contact resistivity was 30 mΩ·cm$^2$ or less, and the tensile strength was 5/6 or more
Δ: the contact resistivity was 30 mΩ·cm$^2$ or less, and the tensile strength was 4/6
x: the contact resistivity was greater than 30 mΩ·cm$^2$, or the tensile strength was 3/6 or less Although fired at the relatively low temperature, the conductive pastes in which the tellurium-based glass falling within the composition range of the present invention was used in combination with the conductive powder of the present invention having the specific surface area shown in the table obtained substantially favorable contact resistivity and satisfied the required standard for their adhesion strength (tensile strength) as shown in Table 1.

TABLE 1

| | Specific surface area of conductive powder [m²/g] | Glass Composition [mol %] | | | | | | | Baking temperature [° C.] | Contact resistivity [mΩcm²] | Tensile strength | Total evaluation |
|---|---|---|---|---|---|---|---|---|---|---|---|---|
| | | Te | W | Zn | B | Zr | Bi | Al | | | | |
| Sample 1 | 0.70 | 34.8 | 26.1 | 26.1 | 8.7 | 4.3 | 0.0 | 0.0 | 780 | 15.18 | 5/6 | ○ |
| Sample 2 | 0.70 | 43.5 | 17.4 | 26.1 | 8.7 | 4.3 | 0.0 | 0.0 | 780 | 15.76 | 5/6 | ○ |
| Sample 3 | 0.70 | 43.5 | 26.1 | 17.4 | 8.7 | 4.3 | 0.0 | 0.0 | 780 | 14.26 | 6/6 | ○ |
| Sample 4 | 0.70 | 43.8 | 21.9 | 17.6 | 8.3 | 8.3 | 0.0 | 0.0 | 780 | 13.18 | 5/6 | ○ |
| Sample 5 | 0.70 | 43.8 | 21.9 | 17.6 | 12.5 | 4.2 | 0.0 | 0.0 | 780 | 13.25 | 5/6 | ○ |
| Sample 6 | 0.70 | 43.8 | 21.9 | 17.6 | 16.7 | 0.0 | 0.0 | 0.0 | 780 | 15.68 | 4/6 | Δ |
| Sample 7 | 0.70 | 45.0 | 22.5 | 18.0 | 8.5 | 6.0 | 0.0 | 0.0 | 780 | 10.78 | 5/6 | ○ |
| Sample 8 | 0.70 | 47.4 | 23.7 | 19.0 | 9.0 | 0.9 | 0.0 | 0.0 | 780 | 17.22 | 5/6 | ○ |
| Sample 9 | 0.70 | 47.8 | 23.9 | 19.2 | 4.5 | 4.5 | 0.0 | 0.0 | 780 | 22.25 | 5/6 | ○ |
| Sample 10 | 0.70 | 47.8 | 23.9 | 19.2 | 9.1 | 0.0 | 0.0 | 0.0 | 780 | 13.49 | 5/6 | ○ |
| Sample 11 | 0.70 | 47.8 | 23.9 | 19.2 | 0.0 | 9.1 | 0.9 | 0.0 | 780 | 15.98 | 4/6 | Δ |
| Sample 12 | 0.70 | 48.9 | 24.5 | 19.6 | 2.3 | 4.7 | 0.0 | 0.0 | 780 | 10.62 | 5/6 | ○ |
| * Sample 13 | 0.70 | 50.0 | 20.0 | 0.0 | 0.0 | 0.0 | 30.0 | 0.0 | 780 | 18.60 | 0/6 | × |
| Sample 14 | 0.70 | 54.5 | 27.3 | 9.1 | 9.1 | 0.0 | 0.0 | 0.0 | 780 | 18.81 | 5/6 | Δ |
| * Sample 15 | 0.70 | 50.0 | 30.0 | 0.0 | 0.0 | 0.0 | 20.0 | 0.0 | 780 | 20.05 | 3/6 | × |
| Sample 16 | 0.70 | 50.1 | 25.0 | 20.1 | 0.0 | 4.8 | 0.0 | 0.0 | 780 | 27.30 | 5/6 | ○ |
| Sample 17 | 0.70 | 51.3 | 25.7 | 20.6 | 2.4 | 0.0 | 0.0 | 0.0 | 780 | 20.44 | 4/6 | Δ |
| Sample 18 | 0.70 | 52.2 | 17.4 | 17.4 | 8.7 | 4.3 | 0.0 | 0.0 | 780 | 22.44 | 5/6 | ○ |
| Sample 19 | 0.70 | 52.2 | 26.1 | 8.7 | 8.7 | 4.3 | 0.0 | 0.0 | 780 | 29.41 | 6/6 | ○ |
| * Sample 20 | 0.70 | 52.6 | 26.3 | 21.1 | 0.0 | 0.0 | 0.0 | 0.0 | 780 | 16.93 | 0/6 | × |
| Sample 21 | 0.70 | 63.6 | 18.2 | 9.1 | 9.1 | 0.0 | 0.0 | 0.0 | 780 | 28.56 | 4/6 | Δ |
| * Sample 22 | 0.70 | 63.6 | 27.4 | 0.0 | 9.0 | 0.0 | 0.0 | 0.0 | 780 | 183.78 | 1/6 | × |
| * Sample 23 | 0.70 | 60.0 | 20.0 | 20.0 | 0.0 | 0.0 | 0.0 | 0.0 | 780 | 14.98 | 0/6 | × |
| * Sample 24 | 0.70 | 60.0 | 25.0 | 0.0 | 0.0 | 0.0 | 15.0 | 0.0 | 780 | 39.80 | 0/6 | × |
| * Sample 25 | 0.70 | 60.0 | 30.0 | 10.0 | 0.0 | 0.0 | 0.0 | 0.0 | 780 | 81.50 | 1/6 | × |
| * Sample 26 | 0.70 | 60.0 | 30.0 | 0.0 | 0.0 | 0.0 | 10.0 | 0.0 | 780 | 21.02 | 0/6 | × |
| * Sample 27 | 0.70 | 60.0 | 40.0 | 0.0 | 0.0 | 0.0 | 0.0 | 0.0 | 780 | 286.77 | 0/6 | × |
| Sample 28 | 0.70 | 60.9 | 17.4 | 8.7 | 8.7 | 4.3 | 0.0 | 0.0 | 780 | 29.11 | 5/6 | ○ |
| * Sample 29 | 0.70 | 63.6 | 27.3 | 0.0 | 4.5 | 4.5 | 0.0 | 0.0 | 780 | 301.34 | 0/6 | × |
| * Sample 30 | 0.70 | 70.0 | 20.0 | 10.0 | 0.0 | 0.0 | 0.0 | 0.0 | 780 | 50.00 | 3/6 | × |
| * Sample 31 | 0.70 | 70.0 | 20.0 | 0.0 | 0.0 | 0.0 | 10.0 | 0.0 | 780 | 251.51 | 6/6 | × |
| * Sample 32 | 0.70 | 70.0 | 0.0 | 30.0 | 0.0 | 0.0 | 0.0 | 0.0 | 780 | 278.01 | 1/6 | × |
| * Sample 33 | 0.70 | 70.0 | 0.0 | 0.0 | 0.0 | 0.0 | 30.0 | 0.0 | 780 | 303.94 | 0/6 | × |
| * Sample 34 | 0.70 | 80.0 | 10.0 | 0.0 | 0.0 | 0.0 | 10.0 | 0.0 | 780 | 237.62 | 0/6 | × |
| * Sample 35 | 0.70 | 80.0 | 0.0 | 20.0 | 0.0 | 0.0 | 0.0 | 0.0 | 780 | 256.94 | 0/6 | × |
| * Sample 36 | 0.70 | 90.0 | 10.0 | 0.0 | 0.0 | 0.0 | 0.0 | 0.0 | 780 | 187.67 | 0/6 | × |
| Sample 37 | 0.70 | 44.5 | 23.5 | 17.8 | 8.5 | 4.0 | 0.0 | 1.7 | 780 | 9.69 | 6/6 | ○ |
| Sample 38 | 0.70 | 43.7 | 24.0 | 17.3 | 8.1 | 4.2 | 0.0 | 2.7 | 780 | 12.33 | 6/6 | ○ |

Next, except that the composition of the glass contained in the conductive pastes and silver powder shown in Table 2 were used and the peak of a firing temperature at which the front electrodes were formed was set at 810° C., the contact resistivity and tensile strength were calculated and evaluated like the cases of the Samples 1-38. The results are shown in Table 2. Specific surface areas shown in Table 2 are measured by a BET method. Note that in the table, samples with a sign * added to their sample numbers are comparative examples. Silver powder used in Sample 39 is an equivalent of silver powder Z described in Japanese Patent Publication No. 2011-96747. Similarly, Sample 40 and Sample 41 are an equivalent of silver powder X and an equivalent of silver powder Y, respectively.

TABLE 2

| | Specific surface area of conductive powder [m²/g] | Glass Composition [mol %] | | | | | Baking temperature [° C.] | Contact resistivity [mΩcm²] | Tensile strength | Total evaluation |
|---|---|---|---|---|---|---|---|---|---|---|
| | | Te | W | Zn | B | Zr | | | | |
| * Sample 39 | 0.22 | 45.7 | 22.9 | 18.3 | 8.7 | 4.3 | 810 | 25.47 | 2/6 | × |
| * Sample 40 | 0.31 | 45.7 | 22.9 | 18.3 | 8.7 | 4.3 | 810 | 17.84 | 1/6 | × |
| * Sample 41 | 0.37 | 45.7 | 22.9 | 18.3 | 8.7 | 4.3 | 810 | 13.38 | 3/6 | × |
| Sample 42 | 0.41 | 45.7 | 22.9 | 18.3 | 8.7 | 4.3 | 810 | 18.36 | 5/6 | ○ |
| Sample 43 | 0.55 | 45.7 | 22.9 | 18.3 | 8.7 | 4.3 | 810 | 18.63 | 6/6 | ○ |
| Sample 44 | 0.90 | 45.7 | 22.9 | 18.3 | 8.7 | 4.3 | 810 | 17.53 | 6/6 | ○ |
| Sample 45 | 1.00 | 45.7 | 22.9 | 18.3 | 8.7 | 4.3 | 810 | 21.57 | 6/6 | ○ |

In addition, for Sample 43, the contact resistivity and tensile strength were calculated and evaluated for each of electrodes like the cases of the Samples 1-38, the electrodes being obtained by firing the Sample 43 at a fixed total firing time of 70 seconds while changing only a firing peak temperature to 720° C., 735° C., 750° C., 780° C., 810° C., and 850° C. without changing its composition. The results are shown in Table 3.

TABLE 3

| Baking temperature [° C.] | Contact resistivity [mΩcm$^2$] | Tensile strength | Total evaluation |
|---|---|---|---|
| 720 | 20.38 | 0/6 | X |
| 735 | 14.00 | 4/6 | Δ |
| 750 | 17.59 | 6/6 | ○ |
| 780 | 13.85 | 6/6 | ○ |
| 810 | 18.63 | 6/6 | ○ |
| 850 | 18.40 | 6/6 | ○ |

As described above, according to the present invention, a conductive paste for forming solar cell electrodes that has a wide process window with respect to a firing temperature, favorable electrical characteristics, and higher adhesion strength to a substrate can be obtained.

REFERENCE SIGNS LIST 1 front electrode
2 Anti-reflection film
3 Diffusion layer
4 Substrate
5 Rear electrode
6 Glass layer

What is claimed is:

1. A conductive paste for forming a solar cell electrode, said conductive paste comprising a tellurium-based glass frit containing, in terms of oxide, 40-60 mol % of tellurium, 20-30 mol % of tungsten, 7-20 mol % of zinc, 5-10 mol % of boron and 1-5 mol % of zirconium, a conductive powder having silver as a main component and a specific surface area of at least 0.4 m$^2$/g and an organic vehicle, wherein 0.1-10 mass parts of the tellurium-based glass frit is contained in the conductive paste with respect to 100 mass parts of the conductive powder.

2. The conductive paste for forming the solar cell electrode according to claim 1, wherein the specific surface area of the conductive powder is no more than 1.0 m$^2$/g.

* * * * *